United States Patent [19]

Taylor et al.

[11] Patent Number: 5,455,935
[45] Date of Patent: Oct. 3, 1995

[54] CLOCK SYNCHRONIZATION SYSTEM

[75] Inventors: Mark A. Taylor, Cupertino; David J. Garcia, San Jose; Paul A. Duffy, Mountain View, all of Calif.

[73] Assignee: Tandem Computers Incorporated, Cupertino, Calif.

[21] Appl. No.: 219,152

[22] Filed: Mar. 29, 1994

Related U.S. Application Data

[62] Division of Ser. No. 709,919, May 31, 1991, abandoned.

[51] Int. Cl.[6] ................................................. G11B 27/00
[52] U.S. Cl. ................................. 395/550; 371/61
[58] Field of Search .......................... 395/575; 371/61, 371/62, 1, 68.3; 364/270.1, 270.2, 271.5, 945.8, 945.9

[56] References Cited

U.S. PATENT DOCUMENTS

| | | | |
|---|---|---|---|
| 4,425,646 | 1/1984 | Kinoshita et al. | 371/61 |
| 4,451,917 | 5/1984 | DeCoursey | 370/108 |
| 4,488,297 | 12/1984 | Vaid | 371/1 |
| 4,490,821 | 12/1984 | Lacher | 371/1 |
| 4,569,065 | 2/1986 | Cukier | 375/120 |
| 4,617,679 | 9/1986 | Brooks | 375/119 |
| 4,637,018 | 1/1987 | Flora et al. | 371/1 |
| 4,677,648 | 6/1987 | Zurfluh | 375/120 |
| 4,696,051 | 10/1987 | Breeden | 455/33 |
| 4,756,010 | 6/1988 | Nelson et al. | 375/94 |
| 4,805,195 | 2/1989 | Keegan | 375/106 |
| 4,807,259 | 2/1989 | Yamanaka et al. | 375/109 |
| 4,817,077 | 3/1989 | Ono | 371/62 |
| 4,833,695 | 5/1989 | Greub | 371/1 |
| 4,847,678 | 6/1989 | McCauley | 358/19 |
| 4,984,255 | 1/1991 | Davis et al. | 375/106 |
| 5,081,629 | 1/1992 | Criswell et al. | 371/68.3 |
| 5,109,506 | 4/1992 | Begun | 371/61 |
| 5,226,152 | 6/1993 | Klug et al. | 395/575 |
| 5,233,615 | 8/1993 | Goetz | 371/68.3 |
| 5,249,188 | 10/1993 | McDonald | 371/68.3 |
| 5,259,006 | 11/1993 | Price et al. | 371/1 |

Primary Examiner—Robert W. Beausoliel, Jr.
Assistant Examiner—Joseph E. Palys
Attorney, Agent, or Firm—Townsend and Townsend and Crew

[57] ABSTRACT

A clock synchronization system includes a clock generator for producing first and second system clock signals that are each received by corresponding ones of a pair of integrated circuits from which the integrated circuits each produce secondary clock signals. The clock system includes synchronizing circuitry that receives the secondary clock signals to determine the phase difference between them, and delaying one of the system clock signals, relative to the other, in a manner that results in the state transitions of the secondary clock signals occur within a period of time of each other.

12 Claims, 5 Drawing Sheets

CLOCK SYNCHRONIZATION SYSTEM

This application is a division of application Ser. No. 07/709,919, filed May 31, 1991, now abandoned.

The present invention is directed generally to data processing systems and, in particular, to clock synchronization system for synchronizing one clock signal to another.

BACKGROUND OF THE INVENTION

Semiconductor fabrication techniques have seen substantial advancements in recent years, permitting large amounts of digital circuitry to be used in cost-effective ways. These advancements, coupled with recent innovations in the design and architecture of data processing systems, have resulted in computing system architectures that are structured in various ways to be fault-tolerant. One such fault-tolerant architecture involves, for example, mating circuitry (e.g., a central processing unit) with substantially identical circuitry (e.g., another central processing unit), and operating both in "lock-step", using the same data and instruction signals to produce processed data. The processed data of one is checked against that of the other to ensure proper operation. Typically, only one of the circuits is responsible for performing system functions; the other operates only to produce (hopefully) substantially identical check data. U.S. Pat. Nos. 4,358,823, 4,785,453, and 4,843,608 illustrate various techniques for operating pairs of processor units or identically structural circuitry in such self-checking modes.

While these various self-checking schemes using pairs (or multiple pairs) of similarly structured circuitry, such as those illustrated in the above-identified patents, are capable of performing their intended self-checking functions, they are not without limitation. For example, operating in lock-step fashion requires careful management and attention to such design characteristics as clock-skew. Data inputs to the individual circuits (e.g., processor units), when obtained from the same source, must be applied and accepted on the proper state transitions of the clock signals that operate both circuits for credible self-checking operation. The same is true for data output signals, particularly those that are used for comparison. In addition, for proper system operation, it is often required that buffering (using, for example, clocked registers) be used to temporarily store data for application to other elements such as, for example, comparator circuitry, in order to maintain the self-checking capability. Data buffering may also be needed when tri-state busses are used to separate input data from output data. All of these characteristics tend to have an impact on cycle time of the operation of the circuitry, add extra components (e.g., memory, etc.), and can operate to extend data paths to external circuitry in order to account, for example, for a slow "master" processor units as compared with a faster "slave" or check processor units caused, among other things, by the speed of component parts and/or relative clock phase.

On the market today are microprocessor units capable of being operated at very high clock speeds (e.g., the R3000 RISC microprocessor manufactured by MIPS Computers, Incorporated of Santa Clara, Calif., which can operate at a 50 MHz clock rate). Attempts to incorporate such high speed microprocessors into the self-checking designs discussed above not only exacerbate the problems described, but create new problems. For the most part, it is very difficult, if not impossible, to operate at these very high clock speeds. In short, present self-checking architectures can severely limit system operating speed.

Accordingly, it is evident that there is a need for apparatus providing comparison between high speed synchronous circuitry for self-checking capability, in real time, and with minimum delay. Preferably, the self-checking capability should provide minimum timing impact to the compared device or circuitry.

SUMMARY OF THE INVENTION

The present invention provides a clock synchronization system for a synchronous circuit design in the form of a central processing unit with self-checking capability utilizing a pair of processor units, that permits one of the processor units to operate substantially without impact by the self-checking capability provided by the other processor unit.

Broadly, the present invention is advantageously used in a data processing system that incorporates a central processing unit, comprising a pair of processor units, termed the "master" and "shadow" processor units, respectively. The master processor unit is coupled to a memory element, which stores instructions and data, by address and data buses, and control lines. The master processor unit operates to generate address signals for accessing data from the memory element, performing data processing activity. Accessed data and instructions are coupled to the shadow processor unit by a "gateway" unit in the form of a synchronously-operated, buffered interface. Address, data, and control signals that are generated by the master processor unit are coupled, also by the gateway unit, to a compare circuitry, which also receives the address, control and data signals generated by the shadow processor unit (in response to the received accessed instructions and data) for comparison. The comparator circuitry produces status signals indicative of the results of the comparison.

Microprocessors are used to implement the master and shadow processor units. The particular microprocessors preferred are structured to receive a periodic clock signal to produce an operating clock signal that has state transitions (e.g., HIGH to LOW) that effect or otherwise cause changes in signals appearing on the address bus, the data bus, and the control lines. Often, particularly in the preferred microprocessors used, the relationship between the received periodic clock signal and the resultant operating clock signal is indeterminant; that is, it can be, and often is, different from microprocessor to microprocessor.

Synchronous transfers are used in the present invention in a manner that permits operation of the shadow processor unit to operate approximately one clock cycle behind the master processor unit; that is, an instruction executed by the master processor unit is executed by the shadow processor unit approximately one operating clock cycle later.

Accordingly, the invention is a clock system that provides a system clock for producing signals that are received by the master and shadow processor units to effect synchronous operation of each. From these system clock signals the master and shadow processor units produce master and shadow clock signals having state transitions indicative of state changes within the master and shadow processor units, respectively. It follows that changes of the respective address, processed data, and control signals by each processor unit will have a predetermined relation to the state transitions of the master and shadow clock signals.

The clock system includes synchronizing circuitry capable of producing the system clock signals in a manner so that when received by the master and shadow processor units the state transitions of the resultant master and shadow clock signals occur within a period of time of each other, i.e., they are in phase—but with an allowed tolerance.

By establishing a known phase relationship between the clock signals used for operating the master and shadow processor units, synchronous transfer of signals between the two are possible. Further, the gateway unit can be operated so that the transfer of instructions and accessed data from the master processor unit to the shadow processor unit, and transfers from each of address, processed data, and control signals to compare or check circuitry can insure that error-checking is done in a minimum amount of time. This will ensure that an error determination can be made before the result of the error spreads too far, if at all.

There are a number of further advantages obtained by the present invention. The operation of the shadow processor unit essentially synchronous with, but approximately to be one clock cycle behind the master processor unit, avoids the tighter clock skew maintenance problems and requirements found in the prior art.

Further, the ability to synchronously transfer data and instructions accessed from the memory unit of the master processor unit to the shadow processor unit permits use of only a single memory element; an additional memory element for the shadow processor unit is no longer needed, and therefore the associated circuitry is also deleted. The shadow processor unit looks to the gateway unit for accessed data and instruction signals.

These and other advantages and aspects of the present invention will become apparent to those skilled in the art upon reading of the following detailed description of the invention, which should be taken in conjunction with accompanying drawings.

DETAILED DESCRIPTION OF THE INVENTION

Figure 1:
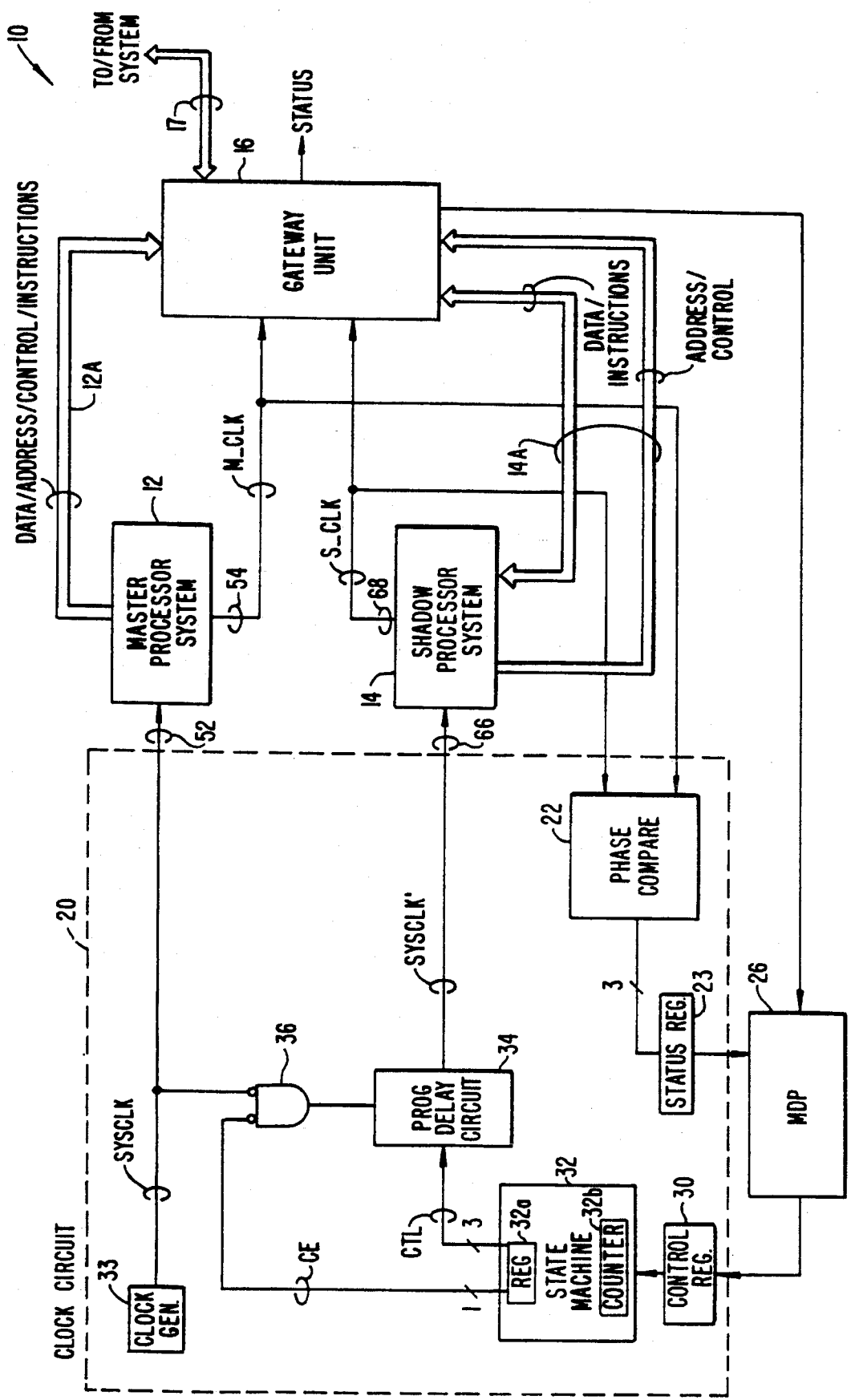
FIG. 1 is a general block diagram, illustrating the overall architecture of a central processor unit, using a pair (a master and a shadow) of processor units, one as a check against the other.

Turning now to the figures, and for the moment FIG. 1, there is illustrated a self-checking central processing unit, designated generally with the reference numeral 10, for use in a data processing system. As shown, the central processing unit 10 includes a master processor system 12 and a shadow processor system 14, a gateway unit 16, and a clock circuit 20. The master and shadow processor systems 12, 14 receive system clock signals (SYSCLK and SYSCLK') from the clock circuit 20, each respectively producing therefrom master and shadow clock signals (M_CLK and S_CLK) that are coupled to the gateway unit 16 as well as to a phase compare circuit 22 of the clock circuit 20.

In implementation, the system portions of the clock circuit 20 (i.e., phase compare circuit 22, status register 23, control register 30) are actually located in the gateway unit 16. They are illustrated in what is believed to be a more logical organization in FIG. 1 for ease of understanding.

In addition to the M_CLK signal, the master processor system 12 communicates data, address, control, and instruction signals to the gateway unit 16 via bus/signal lines 12A. Conversely, the gateway unit can act as transfer point to the master (and shadow) processor systems 12, 14 for data and instructions from outside the systems, i.e., from main memory (not shown) or input/output devices (not shown) via a bus 17. Similarly, the shadow processor system 14 is coupled to the gateway unit 16 by bus/signal lines 14A that communicate data and instructions (originally from the master processor system 12) to the shadow processor system 14, and address, control, and data signals from the shadow processor system 14 to the gateway unit 16.

In the preferred embodiment of the invention, the self-checking central processing unit 10 forms a part of a larger data processing system (not shown) that includes a maintenance diagnostic processor (MDP) 26, typically in the form of a microprocessor. The MDP 26 is utilized, again within the larger confines of the larger data processing system (not shown), to perform various maintenance and diagnostic functions not relevant to the present invention. However, as will be seen, the MDP 26 is used in the present invention to assist in the synchronization functions performed by the clock circuit 20. Thus, responsive to the signalling from the phase compare circuit 22, communicated by a status register 23, the MDP 26 produces control information that is temporarily stored in a control register 30 of the clock circuit 20. The content of the control register 30 is applied to a state machine 32 which, in turn, communicates control (CTL) signals to a programmable delay circuit 34.

The programmable delay circuit 34 receives, via a negative-input AND gate (i.e., NOR gate) 36, the SYSCLK signal from a clock generator 33. The other input of the NOR gate 36 receives a clock enable (CE) signal from the state machine 32. The output of the programmable delay circuit 34 is the SYSCLK' signal that is provided the shadow processing system 14. As will be seen, the SYSCLK' signal is a delayed version of the SYSCLK signal. In response to the CTL signals from the state machine 32, the SYSCLK signal can be delayed an amount sufficient to cause state transitions of the S_CLK signal to occur within a specified period of time of the state transitions of the M_CLK signal, thereby loosely synchronizing the two.

In order for the gateway unit 16 to operate properly, and to allow the shadow processor system 14 to operate approximately one clock cycle time behind the master processor system time, there must be some synchronization between the M_CLK and S_CLK signals. This, as indicated above, is the function of the clock circuit 20. Depending upon the relationship between LOW to HIGH transitions of the M_CLK and S_CLK signals, as determined by the phase comparator circuit 22, the state machine 32 will operate to control the programmable delay circuit 34 to delay the SYSCLK signal an amount that brings the LOW to HIGH transition of S_CLK within a predetermined range of that of M_CLK.

The invention permits some skew tolerance. This is indicated in FIG. 2B, which illustrates the M_CLK and S_CLK signals. The shaded areas 35 of the S_CLK waveform 37 represent the permitted skew tolerance. Therefore, so long as the state transitions (e.g., rising) of the S_CLK signal occur within the shaded area 35, it will be "in phase" with the M_CLK signal.

It may be that the paths to ultimate production of the M_CLK and S_CLK signals will each include a flip-flop (not shown). It can happen, therefore, that at power-up these two flip-flops will come up in different states, causing the M_CLK and S_CLK signals to be about 180° out of phase. In this situation the programmable delay circuit alone may not be able to delay SYSCLK enough. Thus, a search routine is initiated at such times (i e , power-up) to, in effect, "hunt" for the desired phase relationship between the M_CLK and S_CLK signals. Such a routine is illustrated by the flow diagram shown in FIG. 2C.

Figure 2A:
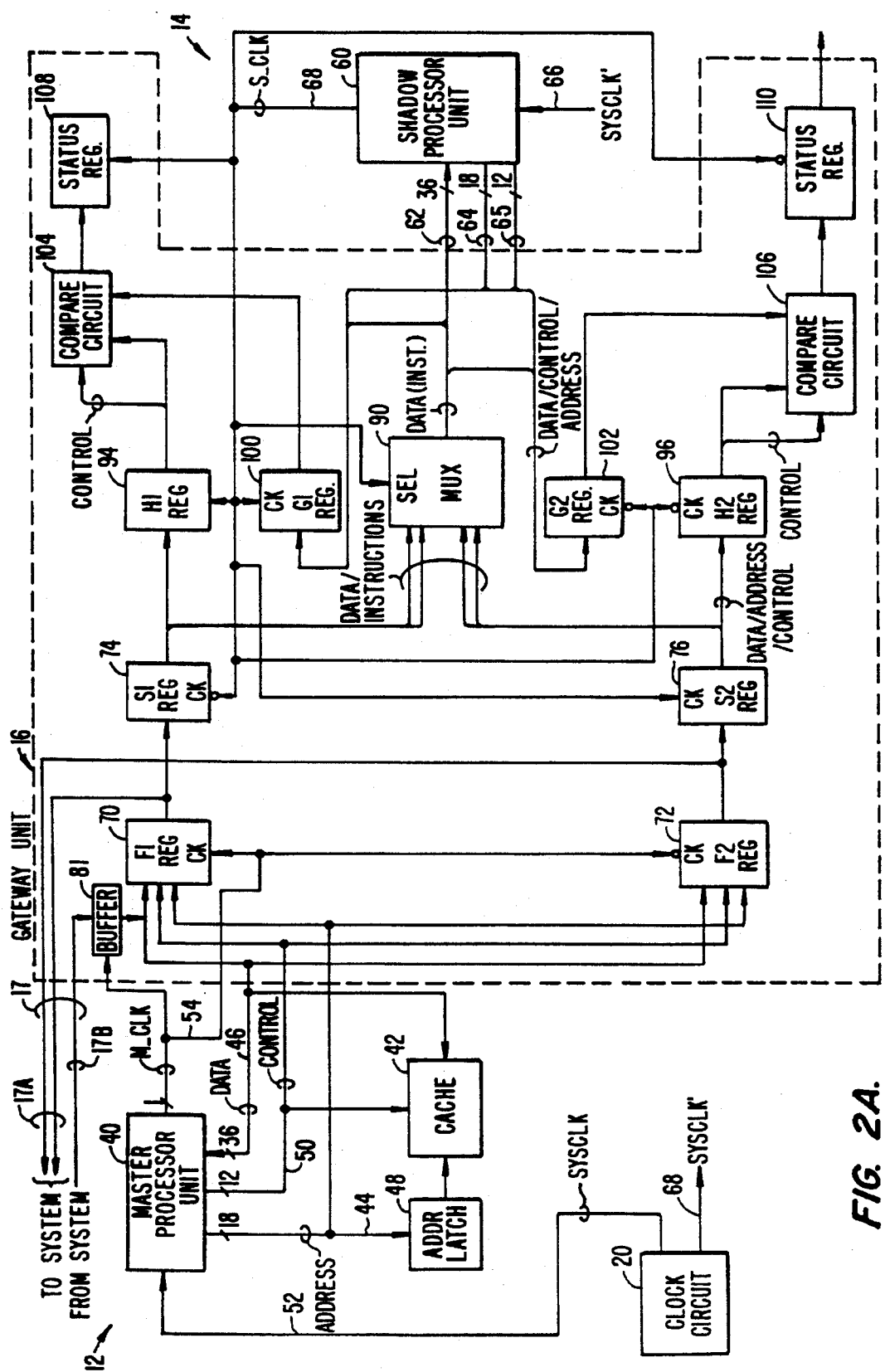
FIG. 2A is a detailed block diagram of the central processor unit of FIG. 1, showing the master and shadow processor systems in greater detail, as well as the detail of the gateway unit that communicates accessed data and instruction signals to the shadow processor system, and address, control, and data signals to compare circuitry for error-checking.
Figure 2B:
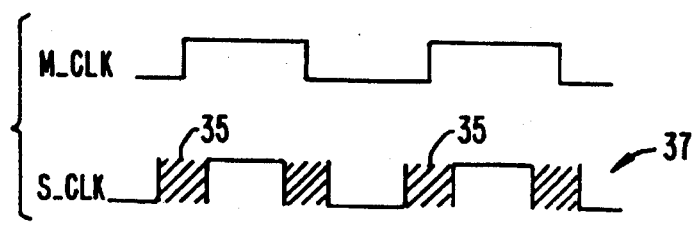
FIG. 2B is a timing diagram, illustrating the allowable skew between S_CLK and M_CLK.
Figure 2C:
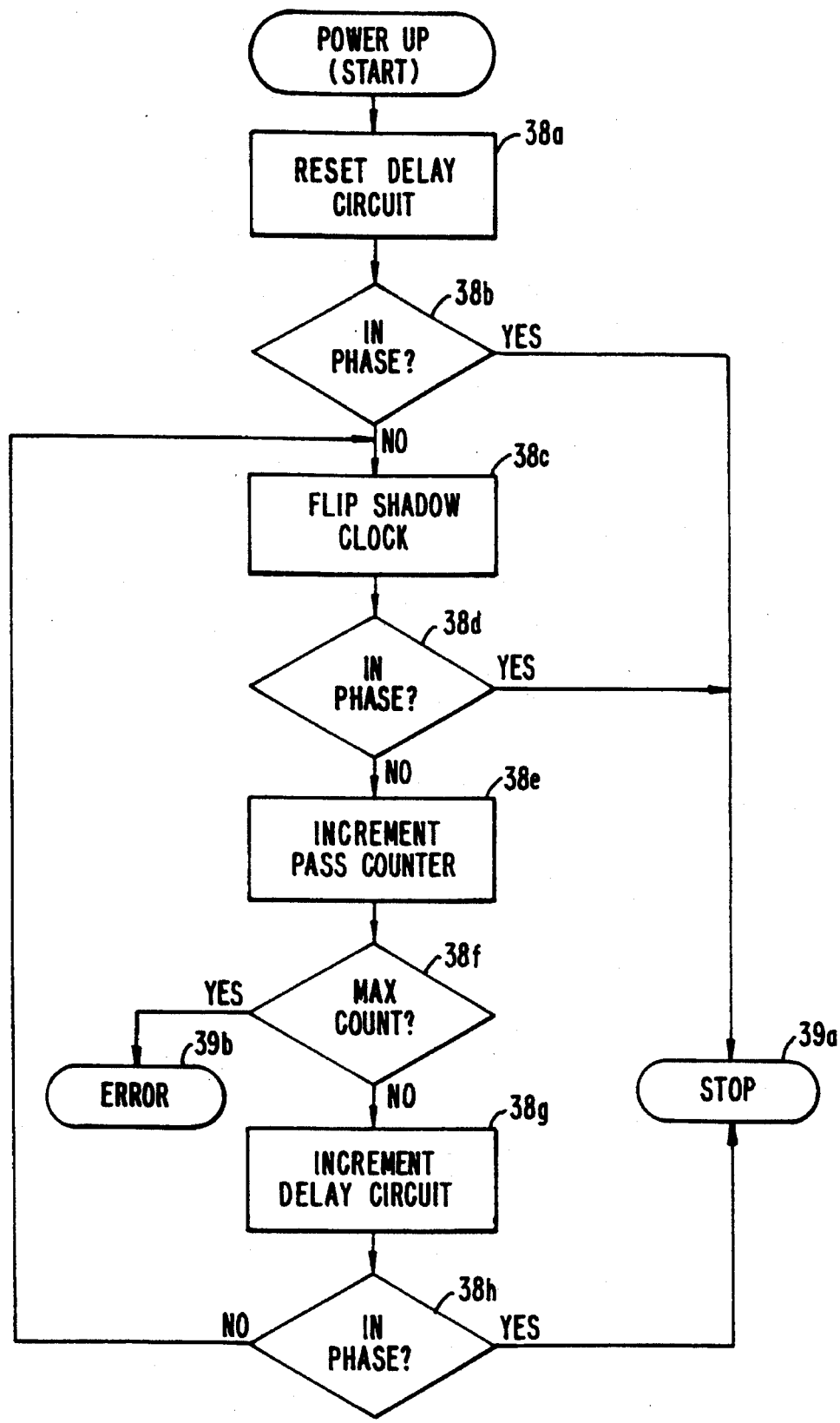
FIG. 2C illustrates the steps taken to synchronize clock signals used by the master and shadow processor systems of FIGS. 1 and 2A.

The routine represented by the flow diagram of FIG. 2C is performed by the MDP 26, through control of the state machine 32, programmable delay circuit 34 and the NOR gate 36. Referring to FIG. 2C, after power-up, and performing various other initialization tasks, the MDP 26 moves to step 38a of FIG. 2C to clear the register 32a of the state machine 32. Register 32a contains the information to select the appropriate delay produced by the programmable delay circuit 34. Clearing the register 32a, in effect, resets the programmable delay circuit to its minimum (zero) delay state. Then, at step 38b, the information provided by the phase compare circuit 22 (FIG. 1) is checked to determine the phase relation between the M_CLK and S_CLK signals. If they are within tolerance, the routine moves to step 39a and stops; the M_CLK and S_CLK signals are within a predetermined phase relationship.

If, however, step 38b indicates that the M_CLK and S_CLK signals are not within the desired phase tolerance of one another, then step 38c is entered. At step 38c the MDP 26 develops, and loads in the control register 30, a control word to command the state machine 32 to assert the clock enable (CE) signal and disable the NOR gate 36 for one-half a clock cycle. Thereby, the SYSCLK' signal to the shadow processor system 14 will lack one HIGH to LOW transition, and one LOW to HIGH transition of SYSCLK. The S_CLK signal is produced from the SYSCLK' signal by the shadow processor 14 of the shadow processor system 14 via circuitry that includes a divide-by-two flip-flop (not shown). Dropping SYSCLK' for one-half clock time of SYSCLK operatively "flips" or effects a 180° shift of S_CLK relative to M_CLK.

Before continuing with a discussion of FIG. 2C, it should be noted, as will be apparent to those skilled in this art, that care must be taken when disabling the NOR gate 36 to ensure that "glitches" (i.e., unwanted state transitions) are not created in the SYSCLK' signal. It will be recognized that the CE signal, when asserted, will be in the form of an envelope, having leading and lagging edges that will encompass a pulse (i.e., two successive state transitions) of the SYSCLK signal. Thus, the leading edge of the CE signal should occur just prior to the first transition of the SYSCLK signal that will be eliminated from the SYSCLK' signal, and the lagging edge of the CE signal should just follow the second state transition of the SYSCLK signal. A preferred timing circuit, which forms a part of the state machine 32, designated with the reference numeral 160, is illustrated in FIG. 5A.

Figure 5A:
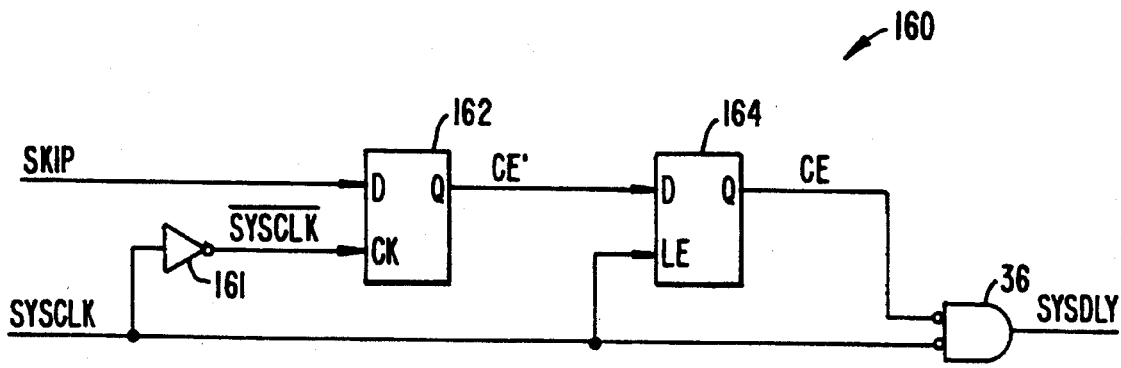
FIG. 5A is a schematic diagram of a preferred timing circuit included in the clock circuit shown i FIG. 1, and used in effecting a 180 (degree) phase shift of the S_CLK signal relative to the M_CLK signal.

Referring to FIG. 5A, the timing circuit 160 is shown as including an edge-triggered, D-type flip-flop 162 coupled to a latch 164. The latch 164 is of the type in which the output (Q) follows the data input (D) while the signal (i.e., SYSCLK) applied to the latch enable (LE) is HIGH. The data at the data input (D) of the latch 164 is captured with the falling edge of SYSCLK.

The flip-flop 162 receives at its data (D) input a SKIP signal generated by the state machine 32. At its clock (CK) input the flip-flop 162 receives an inverted form of the SYSCLK signal from an INVERTOR 161. The output (Q) of the flip-flop 162 produces a version of the CE signal, CE' that is applied to the data (D) input of the latch 164. The latch enable (LE) input of the latch 164 receives the true version of the SYSCLK signal, and the data output (Q) of the latch 164 produces the CE signal that is applied to the NOR gate 36. The output of the NOR gate 36 produces a SYSDLY signal that is applied to the programmable delay circuit 34 (FIG. 1).

Figure 5B:
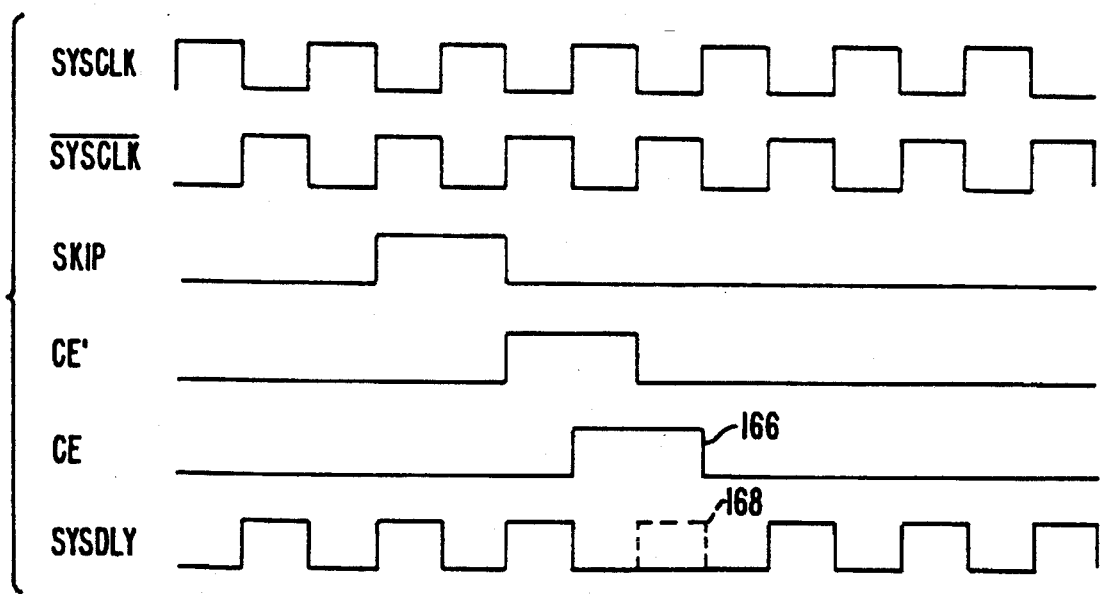
FIG. 5B is a timing diagram, illustrating operation of the timing circuit of FIG. 5A.

FIG. 5B illustrates the operation of the timing circuit 160 by showing the various waveforms involved. As FIG. 5B shows, the SKIP signal, which is one cycle of the SYSCLK signal, is shifted one and one-half cycles of the SYSCLK signal by the timing circuit 160 to become the CE signal. Thus, as FIG. 5B illustrates, the CE signal is asserted while the SYSCLK signal is HIGH, and stays asserted until SYSCLK goes HIGH again, thereby forming a window pulse 166 that completely envelopes two immediately successive state transitions (pulse 168, illustrated in phantom in FIG. 5B) of SYSCLK. In this manner the possibility of extra state transitions being included in the SYSCLK signal is eliminated.

Returning to FIG. 2C, at step 38d of the phase relation of S_CLK and M_CLK is checked; if within tolerance the routine proceeds to step 39a and stops, if not the routine moves to step 38e.

The routine of FIG. 2C is, in effect, a search by trial and error for the desired phase relation between the M_CLK and S_CLK signals. Thus, the routine may be sequenced through a number of times before that relation is found. But, there is a limit to the number of times the operations of steps of FIG. 2C can be used before it is evident that the search is fruitless. (That limit is essentially set by the number of phase incrementations that can be made by the programmable delay circuit 38.) Thus, to preclude a limitless search, a software counter, maintained by the MDP 26, is used to count the number of times the steps of the flow diagram of FIG. 2C are sequenced through.

Therefore, the routine of FIG. 2C moves to step 38e to increment the MDP-maintained software counter, and then to step 38f to check the content of that counter. If the maximum count has been reached, indicating that additional runs through the routine would be fruitless, it (the routine) is exited at step 39b with an error signal. If the maximum count has not been reached, the routine moves to step 38g, from step 38f, to further adjust the S_CLK signal.

At step 38g the MDP 26 formulates and communicates to the state machine 32 (via the control register 30) another control word that will cause the programmable delay circuit 34 to be incremented one more step. The S_CLK signal is shifted, relative to the M_CLK signal, a like amount.

Then, at step 38h, the relationship between the M_CLK and S_CLK signals is checked, and if acceptable (i.e., within the predetermined tolerance) the routine stops at step 39a. If the relationship between M_CLK and S_CLK is not acceptable, then the routine moves to step 38c to try again.

Thus, steps 38c–38h will be executed until (1) the desired phase relationship between the M_CLK and S_CLK signals is established, in which case the routine of FIG. 2C will be exited via step 39a, or (2) it is determined that for whatever reason the desired phase relationship cannot be established, and the routine is exited via step 39b with an error signal.

It will be evident to those skilled in the art that the state machine 32 can be structured to receive, directly, the phase signals produced by the phase compare circuit 22. However, in light of the fact that the overall system of which the central processing unit 10 forms a part includes the MDP 26, making the MDP 26 available, it (the MDP) is used to keep circuit count down. Using the MDP 26 enables the state machine 32 to be formed from fewer circuit components than would be needed if the state machine 32 were to operate directly in response to the phase signals produced by the various compare circuit 22. In addition, use of the MDP 36 permits easy modification of the control algorithm, permitting changes in other parts of the system.

As will be seen, the master and shadow processor systems 12, 14 each include a processor unit (cf. FIG. 2A) operable in response to instructions and data to produce processed data, control signals, and address signals. Only the master processing system 12, however, includes memory for storing instructions and data. Thus, the gateway unit 16 forms a buffered communication path from the master processor system 12 to the shadow processor system 14 for instructions and data accessed from memory and used by the shadow processor system 14. In effect, the gateway unit 16 looks, to the shadow processing system 14, as if it were a memory element accessible by the address and control signals produced by the shadow processor system 14.

The gateway unit 16 also includes compare circuitry that receives processed data, address signals and control signals from both the master and shadow processor systems 12, 14, comparing the received information to produce a STATUS signal indicative of proper (or improper) operation of the central processing unit 10. Processed data of the master processing system 12 only is used for external operation.

Turning now to FIG. 2A, the master and shadow processor systems 12, 14, and gateway unit 16, are illustrated in greater detail. As shown, the master processor system 12 includes a master processor unit 40, preferably a microprocessor, that is coupled to a memory element, here a cache memory 42, by the bus/control line structure 12A, comprising address and data buses 44, 46 and a number 12 of control lines 50. An address latch 48 is included in the path that communicates address signals to the cache memory 42.

The master processor unit 40 receives, on a signal line 52, the SYSCLK signal from the clock circuit 20, producing therefrom the M_CLK signal that is output by the master processor unit 40 on a signal line 54.

The shadow processing system 14 is shown as comprising nothing more than a shadow processor unit 60, a data bus 62, an address 64, and control lines 65. A signal line 66 communicates the SYSCLK' signal from clock from the circuit 20 to the shadow processor unit 40, which in turn will produce the S_CLK signal that is communicated on a signal line 68.

Digressing for a moment, it will be evident to those skilled in this art the use of a cache 42, as the memory system for the processor system 12 will typically imply use of a main memory (not shown) and some system or circuitry for determining when the data/instruction requested by the processor unit 40 is not held by the cache 42 (i.e., a "cache miss"), requiring a download of data/instructions from the main memory (not shown). Typically, such a system will use a "tags" system in which a piece of information that forms a part (usually the high-order portion) of the address (the lower-order portion of the address is used to access the cache 42) is compared with a "tag" that is also stored with each corresponding accessible data/instruction. If the high-order portion of the address does not match the tag that accompanies the piece of information that was accessed from the cache 42, a cache miss is indicated. For non-cache accesses (i.e., to the main memory or other input-output storage—not shown—of the system) the tag lines hold information that forms the high-order portion of the address used for the access. This address information (high-order and low-order portions) are compared between the master and shadow processor systems 12, 14, as will be seen, by compare circuits of the gateway unit 16 when appropriate.

The tag lines are not separately shown, but are included in the data lines, for reasons of clarity. However, it should be understood and appreciated that tag information is supplied for each cache access, and is presented to the master and shadow processor systems 12, 14 (the latter receiving it via the gateway unit 16) for the comparison.

Returning to FIG. 2A, the gateway unit 16 is shown as including a pair of F registers 70, 72 that receive, at their data inputs, the data, address, and control signals of the master processor system 12 (communicated on the address and data buses 44, 46 and the control lines 50). The F1 and F2 registers 70 and 72 receive, at their respective clock (CK) inputs, the M_CLK signal.

As can be seen, the gateway unit 16 includes a number of multi-bit registers for temporary storage, such as the pair of F registers 70, 72. Unless otherwise indicated, all registers that form a part of the gateway unit 16 are edge-triggered devices in that they will receive, hold, and transfer to their respective data outputs the information applied at the input on a state transition of the clock signal applied to their clock (CK) inputs. Certain of the registers of the gateway unit 16 that are clocked on the rising edge (i.e., the LOW to HIGH transition) of the clock signal; the F1 register 70 is one so clocked. Other registers are clocked on the negative or falling edge (i.e., HIGH to LOW transition) of the clock signal; the F2 register 72 is of this type. The "bubble" of the clock input of the F2 register 72 identifies its negative-edge clocking capability; the lack of the bubble signifies positive edge clocking (e.g., the F1 register 70).

For example, the address, data, and control signals then appearing at the inputs of the F1 register 70 at the LOW to HIGH transition (i.e., rising edge) of the M_CLK signal will be stored and will appear at the outputs of the F1 register 70, until the next rising edge. Similarly, the F2 register 72 will register (i.e., store) the information then appearing at its inputs at the falling edge of the M_CLK signal (i.e., the falling edge of the M_CLK signal).

Thus, it can be seen that the clocking arrangement of the F registers 70, 72 is such that the information carried on the address and data buses 44, 46, and control lines 50, is stored on alternate half cycles of the M_CLK signal.

The F registers 70, 72 are coupled to a pair of S registers 74, 76, respectively; they are also communicated to destinations external to the central processing unit 10 by data lines 17A. Data may be returned to the central processing unit 10 via data lines 17B and buffer circuit 81 (clocked by a delayed version M_CLK signal) from, for example, a main memory. Data received by the buffer circuit 81 is momentarily held, and then passed to the data bus 46 of the master processor system 12. This data is re-acquired by the F registers 70, 72 for transfer to the shadow processor system 14.

In order to ensure proper information transfer from register to register in the gateway unit 16, when those registers are clocked by different clocks (i.e., M_CLK, S_CLK), registers interconnected to one another in a data path are clocked on alternate edges of the clock signals applied to each. Thus, for example, the F registers 70, 72 communicate their content to S registers 74, 76, respectively. And, where the F1 register 70 is clocked on the rising edge of the M_CLK signal, the S1 register 74 is clocked on the falling edge of the S_CLK signal. This scheme allows for much more skew (i.e., tolerance) between the M_CLK and S_CLK signals while still maintaining a synchronous interface between the master processor system 12 and the shadow processor system 14.

It will be evident to those skilled in this art that the limitations on how much skew between the M_CLK and S_CLK signals will be tolerated include set-up and hold times required by the devices (e.g., registers) used, the delays encountered in transferring data from one register to another, and the like. Notwithstanding these limitations, it can be seen that much more skew can be tolerated without effecting operation of the synchronous data transfer provided by the gateway unit 16.

The pairs of F registers 70, 72 and S registers 74, 76 store data, address and control signals produced by the master processor unit 40 and/or accessed from the cache 42. Information accessed from the cache 42 can comprise either data words (e.g., operands) or instructions, or both, that effect operation of the master processor unit 40. From the S registers 74, 76, the data is communicated to the shadow processor 60 via a multiplexer unit (MUX) 90. The selector (SEL) input of the multiplexer unit 90 receives the S_CLK signal such that the data/instructions from the S1 register 74 will cause the MUX 90 to drive the data bus 62 of the shadow processor unit 60 during the one-half cycle that the S_CLK signal is LOW; conversely, the data/instruction information held by the S2 register 76 will drive the data bus 62 during the other (HIGH) half cycle of S_CLK.

The address, data, and control signals communicated to and stored in the S registers 74, 76 are also communicated to and temporarily stored in H registers 94, 96, respectively. Each of the H registers 94, 96 is clocked by an edge (HIGH to LOW transition, LOW to HIGH transition) of the S_CLK signal opposite that used to clock the corresponding driving S register. Thus, for example, the H1 register 94 is clocked by the rising edge (i.e., LOW to HIGH transition) of the S_CLK signal, while the S register that drives the H2 register 94 is clocked by the falling edge of the S_CLK signal.

As indicated above, the shadow processor unit 60 operates in substantially identical fashion as the master processor unit 40, receiving the same instructions and data accessed from the cache 42 as does the master processor unit 40. The master processor unit 40 accesses instructions and data (e.g., operands) from the cache 42 for operation, producing processed data for storage in the cache 42, or for communication (via the F registers 70, 72 and the externally directed signal lines 78) externally. The shadow processor unit 60 operates on the same accessed instructions and data, communicated thereto by the gateway unit 16 to the data bus 62 of the shadow processor 60. In the same fashion, the shadow processor unit 60 operatively responds to the received instructions and data to issue address and control signals and to produce processed data, in the same manner as the master processor unit 40. In essence, the MUX 90 looks, to the shadow processor 60, like a cache memory unit supplying the instructions and data in response to the address and control signals.

While the address, control, and processed data signals from the master processor unit 40 are stored in the H registers 94, 96, the same signals (i.e., address, processed data, and control) produced by the shadow processor unit 60 are stored in a pair of G registers 100, 102. The contents of the H registers 94, 96 are compared with the corresponding shadow processor unit produced signals stored in the corresponding G registers 100, 102 by compare circuits 104, 106. The results of the compare are latched in status registers 108, 110.

It is advantageous at this point to pause and consider certain aspects of the gateway unit 16.

First, using the M_CLK signal to control the interface connection of the master processor system 12 to the gateway unit 16, and the S_CLK signal as the interface controller for the shadow processor system 14 to gateway unit 16 connection, greatly simplifies the skew requirement between the M_CLK and S_CLK signals; skew is no longer closely dependent upon one or the other interface connections as in certain prior art structures. Only the needs of the set-up and hold time requirements of the S registers 74, 76 must be kept in mind so they are not violated. In addition, it is preferable that the status registers 108, 110 transfer their information to M_CLK operated registers (not shown) for reporting. Thus, the set-up and hold times of these M_CLK registers (not shown), as well as the propagation delays of the status registers 108, 110 will also dictate skew.

Second, the master processor system 12 is operated as if the shadow processor system 14 were not present. This permits the master processor system 12 to be operated at its upper (mated) limit.

Third, the shadow processor unit 60 is permitted to operate one clock cycle behind the master processor unit 40. For example, instructions accessed from the cache 42, and appearing on the data bus 46 of the master processor unit 40, appears on the data bus 62 of the shadow processor unit 60 approximately one (M_CLK signal) clock cycle later. This, together with the architecture of the gateway unit 16 used to transfer address, data/instruction, and control signals from the M_CLK regime to the S_CLK regime permits much greater clock skew than in prior art systems.

However, some established phase relationship between the M_CLK and S_CLK signals must still be maintained, albeit not as stringent as heretofore required by prior art designs. This is particularly true when using the MIPS R3000 microprocessors as a preferred implementation of the master and shadow processor units 40, 60. Thus, the necessity of some means of establishing and maintaining a phase relationship between the M_CLK and S_CLK signals. More about this later, when the details of the phase compare circuit 22 (FIGS. 1 and 4) are discussed below.

As is known to those skilled in using MIPS R3000 microprocessors, the data, control, and address signals may sometimes be partly indeterminate. The control signals, however, can be interpreted to determine which of the data, address, and control signals are valid, and which are indeterminate. Accordingly, that portion of the content of H registers 94, 96 that forms the control signals transferred from the master processor system 12 is used to qualify the comparison made by the compare circuits 104, 106 that may, at times, be indeterminant. Thus, at certain times only certain of the signals will be compared, the others because of their indefiniteness left uncompared, while at others times all signals may be compared, and at other times certain of the other signals compared, and so on. It is principally those signals that are produced when the master processor unit 40 is driving the busses/control lines 44, 46, 50, that are compared to those of the shadow processor unit 60.

In addition, the control signals themselves are always compared. If they were not, it may be that the control signals could, erroneously, indicate a no compare condition which would be missed.

Another anomaly of the R3000 RISC microprocessors manufactured by MIPS Computers, Inc., shared by other state-of-the-art microprocessor designs, is that such microprocessors receive a system clock signal of one frequency, and produce therefrom their own clock signal at one-half that frequency. The clock signal produced, such as the M_CLK signal produced by the master processor unit 40 from the SYSCLK signal, has state transitions synchronous with changes of signals on the address and data buses 44, 46 and the control lines 50. While the clock signal produced by the R3000 microprocessor is determinate, relative to the data, address, and control signals provided by the microprocessor, it is not specified relative to the received system clock from which it is developed. Thus, the relationship between the clock signals produced by an R3000 microprocessor can vary from microprocessor to microprocessor, even when using the same identical input clock. This means that, when using a pair of R3000 microprocessors, there is no defined relationship between the clocks produced by these microprocessors even when driven by the same system clock.

Thus, it will be evident that, with nothing more, using SYSCLK to drive the master and shadow processor units 40, 60 (implemented using the R3000 microprocessor) will produce M_CLK and S_CLK signals that, most likely, will have no relation to one another. In light of the fact that there must be a synchronous transfer (e.g., of data) between M_CLK regime and the S_CLK regime in the gateway unit 16 (i.e., the F registers 70, 72 and the corresponding S registers 74, 76 that they drive) there should be some synchronous relationship between the M_CLK and S_CLK signals. This is the function of the circuitry of the clock circuit 20. A version of SYSCLK is produced, as SYSCLK' delayed an amount that causes the shadow processor unit 60 to locate the LOW to HIGH transitions of the S_CLK signal relative to those of the M_CLK signal. This requires circuitry to monitor the phase relationships of the M_CLK and S_CLK signals.

Figure 3:
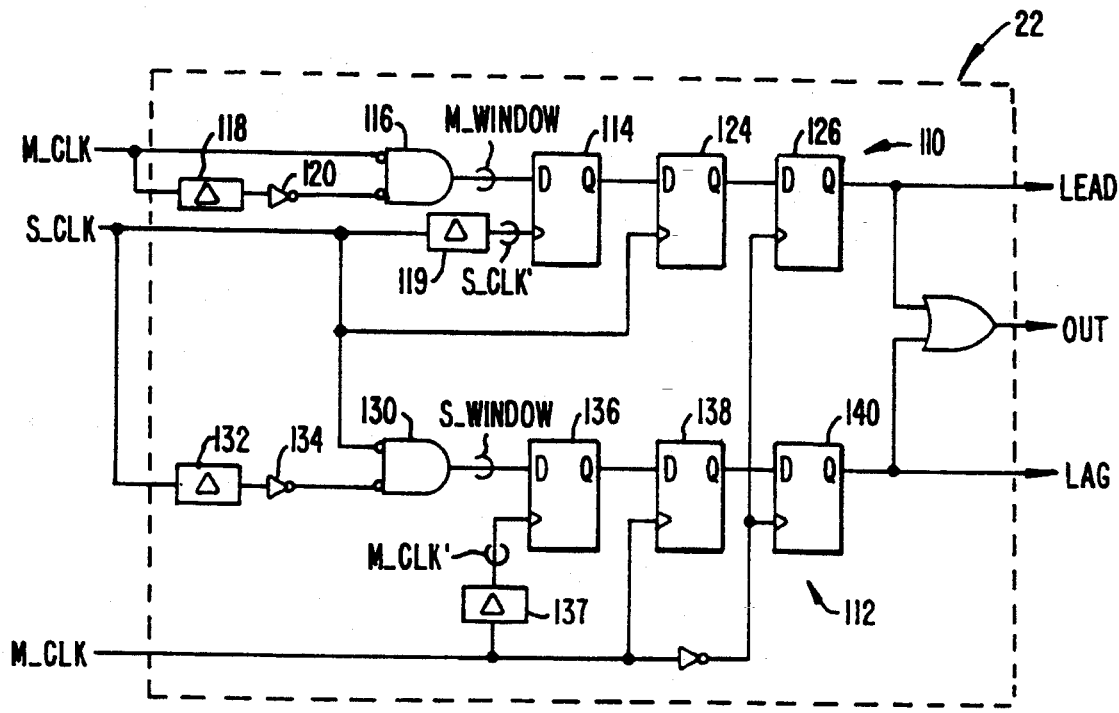
FIG. 3 is a schematic diagram of the phase comparator that forms a part of the clock circuit, shown in FIG. 1, to compare the master and shadow clock signals produced by the master and clock processor units.

Illustrated in FIG. 3, in greater detail, is the phase compare circuit 22. As FIG. 3 shows, the phase compare circuit 22 includes two series paths 110, 112, each containing D-type edge-triggered flip-flops that respectively operate to determine whether the S_CLK signal leads or lags the M_CLK signal.

The series path 110 includes a first D-type, edge-triggered flip-flop 114 that receives, at its data (D) input, an M_WINDOW signal developed by the negative input AND gate 116 from two versions of the M_CLK signal: An unadulterated version of the M-CLK signal (applied to one of the negative inputs of the AND gate 116), and a delayed and inverted version (applied to the other negative input via a fixed delay 118 and an invertor 120). The flip-flop 114 is clocked by a delayed S_CLK signal, S_CLK' received from the fixed delay 119. The true output Q of the flip-flop 114 is applied to the data (D) of a second D-type, edge-triggered flip-flop 124, clocked by the S_CLK signal. The true (Q) output of the flip-flop 124 is, in turn, transferred to a third D-type, edge-triggered flip-flop, clocked by a complemented version of the M_CLK signal. The true output (Q) of the flip-flop 126, when asserted (i.e., HIGH) signals that the S_CLK signal leads the M_CLK signal.

The series path 112 is similarly structured. The S_CLK signal is applied to one negative input of an AND gate 120, while the other input receives a delayed, complemented version of the S_CLK signal via a fixed delay 132, and an invertor 134. The output of the negative input AND gate 130 forms the input to the data (D) input of a D-type edge-triggered flip-flop 136 that is clocked by a delayed version M_CLK signal, M_CLK' via the fixed delay 137. The output (Q) of the flip-flop 136 is coupled to a second D_type edge-triggered flip-flop 138, also clocked by the M_CLK signal. Flip-flop 138, in turn, is transferred to a third D_type, edge-triggered flip-flop 140, which is clocked by the complement of the M_CLK signal. The output (Q) of the flip-flop 140, when asserted, signifies that the LOW to HIGH transition of the S CLK signal lags that of the M_CLK signal.

Before continuing, it should be appreciated that the fixed delays 119 and 137 are used to force an overlap on the M_WINDOW and S_WINDOW signals to ensure that at least one of the two series paths 110, 112 with indicate that S_CLK and M_CLK are "out of phase" when they are at 180° out of phase. Also, setup and hold time requirements of the components used to implement the phase detect circuit 22 (e.g., flip-flops 114, 136, 126) can be violated when the S_CLK and M_CLK signals are exactly, or almost exactly, out of phase, ultimately resulting in an incorrect indication of the true phase relationship. These problems are corrected by the fixed delays 119 and 137, operating to "shift" the S_CLK' and M_CLK' signals respectively applied to the flip-flops 114 and 136 relative to S_CLK and M_CLK (used to clock the remaining flip-flops), as well as moving them into the corresponding M_WINDOW and S_WINDOW signals.

As indicated above, and as can be seen from FIG. 3, the two series paths 110, 112 are symmetrical, and operate substantially identically. Thus, only the series path 110 will be described, using the wave forms illustrated in FIG. 4. It will be evident to those skilled in the art that the following description of the series path 110 will apply equally to the series path 112, reversing the roles of the signals M_CLK and S_CLK.

Figure 4:
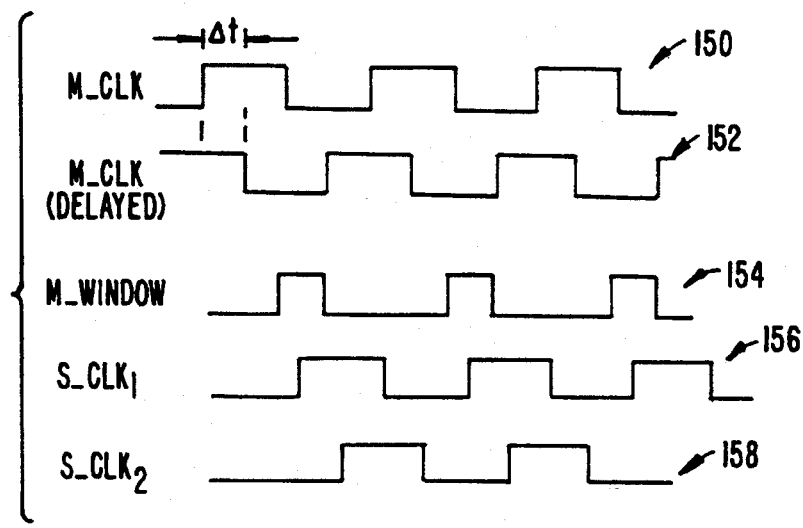
FIG. 4 is a timing diagram showing waveforms used to operate the phase comparator of FIG. 3.

Referring to FIG. 4, the waveforms 150 and 152 illustrate the M_CLK, and the version of M_CLK processed by the fixed delay element 118 and the invertor 120, as received at the negative inputs of the AND gate 116. The waveform 154, M_WINDOW, is the output of the AND gate 116 that is applied to the D input of the flip-flop 114.

Focusing, for the moment, on the waveforms 150, 152 and 154, and the series path 110, it should be evident that the LEAD signal propagated from the flip-flop 114 will be asserted (i.e., HIGH) on the rising edge of the S_CLK signal only when the M_WINDOW is true. The M_WIN- DOW signal, in effect, designates the area of unacceptable lead of the S_CLK signal relative to the M_CLK signal. That portion of time illustrated as being defined in FIG. 4 by the falling edge of M_WINDOW (waveform 154) and the rising edge of the M_CLK signal (waveform 150) is acceptable lead of the S_CLK signal relative to the M_CLK signal.

In a similar fashion, the S_WINDOW (FIG. 3) identifies a similar area of unacceptable/acceptable lag of S CLK relative to the M_CLK signal.

Thus, for example, assume that the waveform 156 represents a version of S_CLK, $S\_CLK_1$, that leads the M_CLK by an unacceptable amount, i.e., the rising edge of $S\_CLK_1$ occurs during (i.e., when HIGH) of the M_WINDOW signal. The rising edge of S_CLK will set the flip-flop 114, the next rising edge will transfer that information to the flip-flop 124, which in turn will transfer it to the flip-flop 126 on a falling edge (i.e., inverted rising edge) of the M_CLK signal, asserting the LEAD signal.

So asserted, the LEAD signal is communicated from the phase compare circuit 22 to the MDP 26 (FIG. 1). In response, the MDP 26 will formulate a control word that is loaded in the control register 30 and applied to the state machine 32. The state machine 32 will, in response, assert signalling on the CTL signal lines that is applied to the programmable delay circuit 34 to cause the SYSCLK' to be delayed further from SYSCLK. Since, as FIG. 1 illustrates (and, to a certain extent, FIG. 2), the SYSCLK is applied to the master processing system 12 for developing the M_CLK, and the delayed version of the SYSCLK, i.e., SYSCLK' is applied to the shadow processing system 14 to develop S_CLK, further delaying SYSCLK' will also further delay S_CLK. Another way of looking at it is that the programmable delay circuit 34 accounts for the processing delays imposed by the master and shadow processor units 40, 60 (FIG. 2) in developing the M_CLK and S_CLK signals from the SYSCLK.

In any event, the delay imposed upon SYSCLK by the programmable delay circuit 34 to produce SYSCLK' will, in effect, diminish the lead of S_CLK relative to M_CLK, ultimately producing a waveform such as waveform 158 in FIG. 4 ($S\_CLK_2$).

Then, if the S_CLK signal that is applied to clock the flip-flop 114 assumes the timing of $S\_CLK_2$ (waveform 158), the rising edge occurs when the M_WINDOW is not HIGH. Flip-flop 114 will be reset, and its Q output will go LOW. This condition is transferred to flip-flop 124, and ultimately to flip-flop 126, deasserting the LEAD signal. This information is relayed by the phase compare circuit 22 to the MDP 26 which formulates a new control word that is stored in the control register 30 to cause the state machine 32 to, in effect, lock the programmable delay circuit 34.

What is claimed is:

1. In a data processing system having at least first and second digital circuits of the type respectively operable in response to receipt of first and second periodic system clock signals to produce therefrom first and second periodic digital signals, apparatus for synchronizing the first and second periodic digital signals so that corresponding state transitions of each occur within a period of time, the apparatus comprising:

phase comparing means coupled to receive the first and second periodic digital signals for producing a phase signal indicative of occurrence of state transitions of the second periodic digital signal occurring within the period of time of corresponding state transitions of the first periodic digital signal;

control means coupled to the phase comparing means for receiving and delaying the first periodic system clock signal to provide a delayed first periodic system clock signal to the second digital circuit as the second periodic system clock signal in response to the phase signal when the occurrence of the state transitions of the second periodic digital signal are not within the corresponding state transitions of the first periodic digital signal.

2. The apparatus of claim 1, wherein the phase comparing means includes defining means responsive to the first and second periodic digital signals to define the period of time.

3. The apparatus of claim 2, wherein the defining means includes first circuit means coupled to receive the first periodic digital signal to produce a first window signal indicative of a lead time period outside the period of time, and second circuit means coupled to receive the corresponding second periodic digital signal to produce a second window signal indicative of a lag time period outside the period of time.

4. The apparatus of claim 3, wherein the defining means includes first and second temporary storage means responsive to the predetermined state transitions of the corresponding second and first periodic digital signals to sample and store the first and second window signals, respectively, producing therefrom the phase signals.

5. The apparatus of claim 1, wherein the control means includes delay means for receiving and delaying the first system clock signal to provide the second system clock signal.

6. The apparatus of claim 5, wherein the delay means is responsive to information indicative of the phase signals for selecting a delay amount for delaying the system clock signal.

7. Apparatus for comparing a pair of periodic digital signals to one another to determine whether a state transition of a one of the pair of periodic digital signals occurs within a selected time period of a state transition of the other of the pair of periodic digital signals, the apparatus comprising:

means for developing from each of the pair of periodic digital signals a window signal defining a predetermined time period that contains the state transition of the one of the pair of periodic digital signals;

first circuit means for sampling the window signal at the state transition of the one of the pair of periodic digital signals;

second circuit means for sampling the window signal at the state transition of the other of the pair of periodic digital signals; and means coupled to the first and second circuit means for determining whether the state transitions of the pair of periodic digital signals occurred within the selected time period.

8. A phase detection circuit for determining whether a state transition of a first periodic signal occurs within a time period of a state transition of a second period signal, the phase detection circuit comprising:

a first circuit producing a first window signal from the first periodic signal and a delayed version of the first periodic signal;

a second circuit sampling the first window signal at the state transition of the second periodic signal to produce therefrom a first output signal indicative of the relative occurrence of the state transition of the second periodic signal to the state transition of the first periodic signal;

a third circuit producing a second window signal from the second periodic signal and a delayed version of the second periodic signal; and a fourth circuit sampling the second window signal at the state transition of the first periodic signal to produce therefrom a second output signal indicative of the relative occurrence of the state transition of the first periodic signal to the state transition of the second periodic signal.

9. The phase detection circuit of claim 8, wherein the first and second output signals respectively indicate whether the second periodic signal leads or lags the first period signal.

10. A circuit for determining whether a predetermined state transition of a first periodic signal occurs within a time period of a state transition of a second periodic signal, the circuit comprising:

first means for developing from the first and second periodic signals, and delayed versions of each a window signal, indicative of the time period;

second means responsive to the window signal, and to the state transition of the first periodic signal, to provide an output signal indicative of whether the state transition of the first periodic signal occurs before the state transition of the second periodic signal; and third means responsive to the window signal, and to the state transition of the second periodic signal, to provide an output signal indicative of whether the state transition of the second periodic signal occurs before the state transition of the first periodic signal.

11. In a data processing system that includes first and second digital circuits respectively operating in response to receipt of first and second periodic system clock signals to produce therefrom first and second periodic digital signals, apparatus for synchronizing the first and second periodic digital signals so that corresponding state transitions of each occur within a predetermined period of time, the apparatus comprising:

a compare circuit coupled to receive the first and second periodic digital signals to produce therefrom a phase signal indicative a difference of occurrence of corresponding state transitions of the first and second periodic digital signals;

a delay circuit coupled to receive the first periodic system clock signal to produce the second system clock signal; and a control circuit coupled to receive and delay the first periodic system clock signal in response to the phase signal.

12. A method for synchronizing first and second periodic digital signals so that corresponding state transitions of each occur within a predetermined time period, the first and second periodic digital signals being respectively produced by first and second digital circuits that respectively operate in response to receipt of first and second periodic system clock signals to produce the first and second periodic digital signals, the method comprising the steps of:

comparing a phase difference between the first and second periodic digital signals to produce a phase signal indicative of relative occurrence of corresponding state transitions of the first and second periodic digital signals;

producing the second periodic system clock signal from the first periodic system clock signal; and delaying the second periodic system clock signal by an amount indicative of the phase signal.

\* \* \* \* \*